United States Patent [19]

Kruzhanov et al.

[11] 4,247,343
[45] Jan. 27, 1981

[54] METHOD OF MAKING SEMICONDUCTOR INTEGRATED CIRCUITS

[76] Inventors: Jury V. Kruzhanov, 103498, korpus 431, kv. 112; Viktor P. Dubinin, 103498, korpus 445, kv. 120; Viktor I. Ovchinnikov, 103527, korpus 839, kv. 11; Vladimir E. Safronov, 103527, korpus 811, kv. 146, all of Moscow, U.S.S.R.

[21] Appl. No.: 954,574

[22] Filed: Oct. 25, 1978

[30] Foreign Application Priority Data

Nov. 2, 1977 [SU] U.S.S.R. .............................. 2540035

[51] Int. Cl.³ .................... H01L 27/04; H01L 29/08; H01L 21/265
[52] U.S. Cl. .................................. 148/1.5; 148/175; 148/187; 357/41; 357/42; 357/44; 357/91
[58] Field of Search .................. 148/1.5, 175, 187; 357/40, 41, 42, 44, 91

[56] References Cited

U.S. PATENT DOCUMENTS

| | | | |
|---|---|---|---|
| 3,575,741 | 4/1971 | Murphy | 148/175 |
| 3,717,507 | 2/1973 | Abe | 148/1.5 |
| 3,925,105 | 12/1975 | Sloan, Jr. | 148/1.5 |
| 3,930,909 | 1/1976 | Schmitz et al. | 148/175 |
| 3,969,748 | 7/1976 | Horie et al. | 357/46 |
| 3,971,059 | 7/1976 | Dunkley et al. | 357/44 |
| 4,018,627 | 4/1977 | Polata | 148/1.5 |
| 4,025,364 | 5/1977 | Smith | 148/1.5 |
| 4,054,899 | 10/1977 | Stehlin et al. | 357/44 |
| 4,075,039 | 2/1978 | Sloan, Jr. | 148/1.5 |
| 4,087,900 | 5/1978 | Yiannoulos | 29/578 |

Primary Examiner—L. Dewayne Rutledge
Assistant Examiner—Upendra Roy
Attorney, Agent, or Firm—Steinberg & Raskin

[57] ABSTRACT

The proposed method of making semiconductor integrated circuits comprises sequential formation on a p-substrate of a first layer of n-regions, an epitaxial p-layer, a second layer of n-regions with an oxide layer, a third layer of p- and n-regions formed by opening holes in the oxides layer and ionic implantation of appropriate dopants, as well as deep diffusion of the latter, conducted in an inert medium, the final step being interconnection metallization. A semiconductor integrated circuit thus produced comprises p-resistors based on a portion of the epitaxial p-layer, confined by n-regions, n-p-n transistors each having a collector isolating it from the other circuit components and based on n-regions of the first and second layers, a base formed by a portion of the epitaxial p-layer and confined by the collector region, and an emitter in the form of an n-region of the third layer, made in the base region. The circuit also comprises p-n-p transistors in a common-collector arrangement, n-resistors and lateral p-n-p transistors based on n-regions of the second layer and shaped as a prism the entire base whereof is contiguous to the substrate and the surface portion whereof contains at least one p-region of the third layer and/or at least one n-region of the third layer, the hole concentration in the p-regions of the third layer being at least five times higher than the electron concentration in the n-regions of the second layer.

2 Claims, 6 Drawing Figures

METHOD OF MAKING SEMICONDUCTOR INTEGRATED CIRCUITS

FIELD OF THE INVENTION

The present invention relates to semiconductor integrated electronics and microelectronics, and more particularly to a method of making semiconductor integrated circuits and to a circuit made by this method.

The invention can most advantageously be used in the production of various digital and linear integrated circuits and devices based on active and/or passive components, such as bipolar and unipolar transistors, diodes, resistors, and capacitors, and particularly in the production of integrated circuits for semiconductor memories.

BACKGROUND OF THE INVENTION

Known in the art is a method of making semiconductor integrated circuits (cf. U.S. Pat. No. 3,575,741; Cl. HO117/64), also referred to as the collector-diffusion-isolation (CDI) technique, which permits producing circuits containing self-isolated transistors, i.e. transistors in which the isolating region is combined with the collector region. Such circuits are highly advantageous, from the standpoint of the degree of integration, over circuits in which the isolating region is not combined with the collector one and occupies additional space on the wafer.

In this prior art method, a first layer comprising a plurality of n-regions is formed in the surface layer of a semiconductor p-substrate, then an epitaxial p-layer is deposited on the surface of the substrate, which is followed by formation, in the epitaxial layer, of a second layer comprising a plurality of n-regions, with an oxide layer being formed on the surface. Thereafter, a third layer is formed in the surface layer, comprising a plurality of regions of both conductivity types, and the final step is interconnection metallization. According to this method, the third layer is formed as follows. Holes are opened in the oxide layer to form p-regions, then a donor impurity is implanted by diffusion, followed by deep diffusion of this impurity in an oxidizing atmosphere. As a result, another oxide layer is formed on the surface. In the resulting oxide layer, holes are opened to provide for electric contact of different regions of the structure with the metallic interconnections, whereafter the latter are metallized.

After the first oxide layer has been formed on the surface, the deep diffusion in an oxidizing atmosphere is conducted twice, while forming the regions of the second layer, with a new oxide layer being formed twice on the surface. Therefore, the resulting oxide layer underlying the interconnection metallization layer has a varying thickness and features a plurality of steps on its surface. This does not permit forming metallic interconnections (conductors) of small thickness, hence, of small width.

Apart from increasing the width of a metallic conductor, its thickening also results in a longer minimum distance between adjacent conductors. This reduces the degree of integration of a circuit. The high irregularity of the surface, residing in the presence of steps on the oxide layer surface, impairs the circuit reliability.

In addition, conducting deep diffusion in an oxidizing atmosphere necessitates subsequent opening of contact holes. This not only complicates the process of production of a circuit, but also reduces the degree of its integration, for it increases the size of the regions of the third layer because of the necessity to align the holes with respective regions of the third layer.

A semiconductor integrated circuit produced by the prior art method comprises n-p-n transistors and p-resistors. The collector of each n-p-n transistor comprises an n-region of the first layer with an annular n-region of the second layer surrounding it over its perimeter. The collector also serves as a region isolating this transistor from the other circuit components. The base of an n-p-n transistor is formed by a portion of the epitaxial p-layer, confined by the collector region, while the emitter of each transistor is formed by an n-region of the third layer, which is in the base region. The collector contact region is formed by an n-region of the third layer, occupying the annular n-region of the second layer, while the base contact region is formed by a p-region of the third layer, which is in the base region. Each p-resistor is based on a portion of the epitaxial p-layer, confined and isolated from the other circuit components by an n-region of the first layer with an annular n-region of the second layer being provided along its perimeter, the p-region of the third layer, which is formed in the p-resistor region, serving as a region of its contact.

The known integrated circuit lacks such components as p-n-p transistors.

Since a greater number of different components in an integrated circuit permits building more devices on its basis and improving the parameters of these devices, coexistence in the known circuit of n-p-n and p-n-p transistors would have made it possible to create devices with a higher degree of integration and, in some cases, e.g. in integrated circuits of a semiconductor memory, to improve its fast response and power consumption.

Besides, the prior art circuit contains only resistors of a p-type material, which require an isolating n-region occupying additional space on the wafer. This also reduces the degree of circuit integration.

SUMMARY OF THE INVENTION

It is an object of the present invention to facilitate production of semiconductor integrated circuits.

Another object of the invention is to increase the degree of circuit integration.

Still another object of the invention is to provide a highly reliable circuit.

Yet another object of the invention is to increase the number of types of components formed in an integrated circuit.

A further object of the invention is to provide an integrated circuit which, when used in semiconductor memory devices, will improve the fast response and power consumption of the latter.

These objects are attained by that, in a method of making semiconductor integrated circuits, comprising formation, in the surface layer of a semiconductor p-substrate, of a first layer including a plurality of n-regions, deposition, on the surface of the substrate, of an epitaxial p-layer, formation, in the epitaxial p-layer, of a second layer including a plurality of n-regions with an oxide layer being formed on the surface, formation, in the surface layer, of a third layer including a plurality of regions of a first and second types of conductivity, by way of sequential opening of holes in the oxide layer of implantation therethrough of dopants of a first and second types with subsequent deep diffusion thereof, and interconnection metallization, according to the invention, during formation of the regions of the third layer, holes are sequentially opened in the oxide layer to form the regions of the first type of conductivity, the dopant of the first type is ionically implanted, holes are opened in the same oxide layer to form the region of the second type of conductivity, the dopant of the second type is ionically implanted in a concentration insufficient for inversion of the conductivity type in the regions of the first type of conductivity of the third layer, and the dopants of both types are diffused by deep diffusion conducted in an inert medium.

In some cases, it is advisable that the ionic implantation of the dopant of the first type be followed by additional deep diffusion thereof in an inert medium.

The objects of the present invention are also attained in that, a semiconductor integrated circuit made by the above method and comprising p-resistors and n-p-n transistors, each having a collector which is essentially a region isolating the n-p-n transistor from the other circuit components and formed by one of the n-regions of the first layer, with an annular n-region of the second layer being provided along the perimeter of said n-region of the first layer, a base formed by a portion of the epitaxial p-layer, confined by the collector region, and an emitter formed by one of the n-regions of the third layer, which is in the base region, the n-region of the third layer, formed in the annular n-region of the second layer, being a region of collector contact, the p-region of the third layer, formed in the base region, being a region of base contact, each p-resistor being based on a portion of the epitaxial p-layer and confined as well as isolated by an n-region of the first layer, with an annular n-region of the second layer being provided along the perimeter of said n-region of the first layer, and the p-region of the third layer, formed in the region of the p-resistor, being a region of its contact, according to the invention, comprises components based on n-regions of the second layer, shaped as a prism the entire base whereof is contiguous to the substrate and the surface layer whereof contains at least one p-region of the third layer and/or at least one n-region of the third layer, the hole concentration in a p-region of the third layer being at least five times higher than the electron concentration in an n-region of the second layer.

It is preferable that the components of the semiconductor integrated circuit should include p-n-p transistors with a common collector, each transistor being based on an n-region of the second layer, which is essentially the base region and contains at least one p-region of the third layer, serving as the emitter, and the collector of the p-n-p transistors being formed by adjacent portions of the epitaxial layer and the substrate.

It is also preferable that the components of the semiconductor integrated circuit should include n-resistors each being based on n-regions of the second layer.

Preferably, the components of the semiconductor integrated circuit should include lateral p-n-p transistors each being based on an n-region of the second layer, which is essentially the base region and contains at least two p-regions of the third layer, one serving as the collector and the other, as the emitter.

An n-region of the second layer of the semiconductor integrated circuit should preferably contain at least one n-region of the third layer, serving as a contact region.

In the proposed method, owing to the above-described process of formation of the regions of the third layer, the surface of the oxide layer under the interconnection metallization layer is less irregular, the size of the third layer regions is reduced, and the process of producing semiconductor integrated circuits is simplified and facilitated as a whole.

In the proposed integrated circuit, the number of component types is increased along with the degree of integration and reliability.

BRIEF DESCRIPTION OF THE DRAWINGS

The invention will now be described in greater detail with reference to specific embodiments thereof, taken in conjunction with the accompanying drawings, wherein.

DETAILED DESCRIPTION OF THE INVENTION

The proposed method of making semiconductor integrated circuits is as follows.

Figure 1A:
FIG. 1a, b, c, d illustrates the sequence of steps of producing a semiconductor integrated circuit shown in cross section, according to the invention.
Figure 1B:
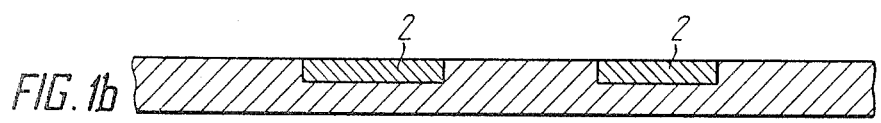
Figure 1C:
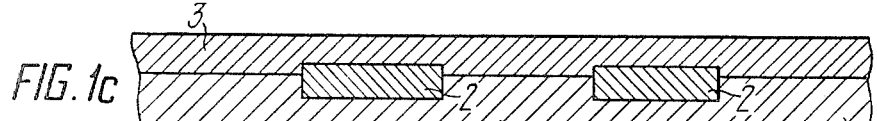
Figure 1D:
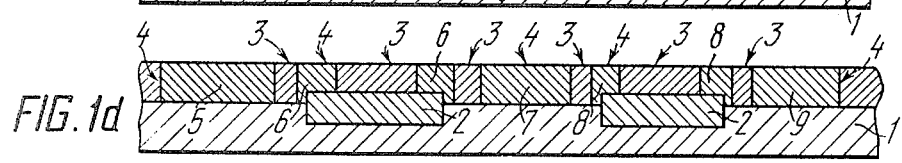
Figure 1E:
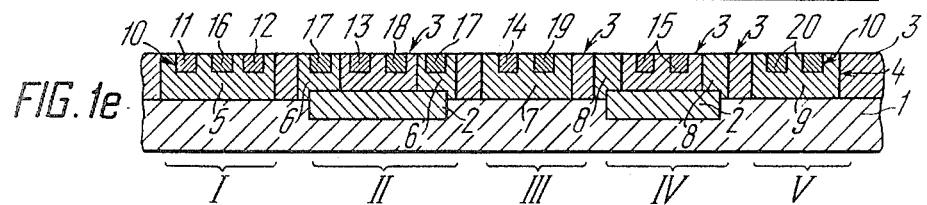

In the surface layer of a semiconductor p-substrate (FIG. 1a), a first layer is formed, including a plurality of n-regions 2 (FIG. 1b). Deposited on the surface of the substrate 1 with the regions 2 is an epitaxial p-layer 3 (FIG. 1c) in which a second layer 4 (FIG. 1d) is formed, including a plurality of n-regions 5, 6, 7, 8 and 9, with an oxide laybeing formed on the surface. Then, a third layer 10 (FIG. 1e) is formed, including a plurality of regions 11, 12, 13, 14, 15 of a first type of conductivity and regions 16, 17, 18, 19, 20 of a second type of conductivity.

Therewith, holes are opened in the oxide layer for ionic implantation therethrough of a dopant of a first type to form the regions 11, 12, 13, 14 and 15, then, in the same oxide layer, other holes are opened for ionic implantation therethrough of a dopant of a second type to form the regions 16, 17, 18, 19 and 20, the dopant of the second type being implanted in a concentration insufficient for inversion of the conductivity type in the regions 11, 12, 13, 14 and 15.

Then, the dopants of both types are diffused by deep diffusion in an inert medium, the final step being interconnection metallization.

Figure 2:
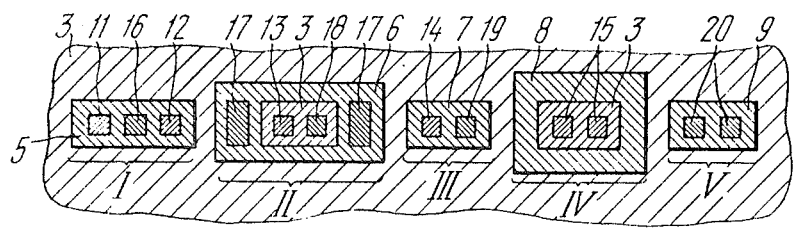
FIG. 2 is a plan view of a portion of a semiconductor integrated circuit made according to the invention.

A semiconductor integrated circuit produced by the proposed method comprises a lateral p-n-p transistor I (FIG. 2), an n-p-n transistor II, a p-n-p transistor III with a common collector, a p-resistor IV and an n-resistor V.

The lateral p-n-p transistor I is based on the n-region 5 of the second layer 4, which is the base region of the transistor I. Formed in this region 5 are two p-regions 11 and 12 of the third layer 10. The region 11 is the collector of the transistor I. The contact region of the transistor I is based on the n-region 16 of the third layer 10.

Another circuit component, the n-p-n transistor II comprises a collector which is essentially a region isolating the n-p-n transistor II from the other circuit components. The collector is formed by an n-region 2 (FIG. 1e) of the first layer, with an annular n-region 6 of the second layer 4 being formed along the perimeter thereof. The base of the n-p-n transistor II is formed by a portion of the epitaxial p-layer 3, confined by the collector region, while the emitter is formed by the n-region 18 of the third layer 10, which is in the base region.

The n-region 17 of the third layer 10, formed in the annular region 6, is the collector contact region.

The p-region 13 of the third layer 10, formed in the base region, is the base contact region.

In the proposed circuit, a p-n-p transistor III is formed, having a common collector with other similar transistors III.

In the p-n-p transistor III, the base region is based on the n-region 7 of the second layer 4, the emitter is based on the p-region 14 of the third layer 10, formed in the region 7, and the collector of the p-n-p transistor III is formed by adjacent portions of the epitaxial p-layer 3 and the substrate 1.

The n-region 19 of the third layer 10 is the contact region of the base of the p-n-p transistor III.

Still another component of the proposed circuit is the p-resistor IV based on a portion of the epitaxial p-layer 3, confined and isolated by an n-region 2 of the first layer, with an annular n-region 8 of the second layer 4 being formed along the perimeter thereof, the p-regions 15 of the third layer 10, formed in the region of the p-resistor IV, being the regions of its contact.

The proposed semiconductor circuit also comprises the n-resistor V based on the n-region 9 of the second layer 4.

The n-regions 20 of the third layer 10 are the contact regions of the n-resistor V.

The lateral p-n-p transistor I, p-n-p transistor III and n-resistor V are based, respectively, on the n-regions 5, 7 and 9 of the second layer 4, shaped as a prism the entire base whereof is contiguous with the substrate 1.

The hole concentration in the p-regions 11, 12 and 14 of the third layer 10 is at least five times higher than the electron concentration in the n-regions 5 and 7 of the second layer 4.

In the proposed method of making semiconductor integrated circuits, no thermal treatment in an oxidizing atmosphere is involved in forming the regions of the third layer 10. To this end, ionic implantation of dopants is used instead of implantation by diffusion, and the deep diffusion is conducted in an inert medium, rather than in an oxidizing atmosphere.

In addition, since the ionically implanted dopant of the second type may also penetrate the regions 11, 12, 13, 14 and 15 of the first type of conductivity, the dopant concentration in the regions 16, 17, 18, 19 and 20 of the second type of conductivity must be insufficient for inversion of the conductivity type in the regions 11, 12, 13, 14 and 15 of the first type of conductivity. In other words, that dopant is to be implanted first, whose concentration in the circuit must be higher. Since no thermal treatment in an oxidizing atmosphere is involved, the thickness of the oxide layer which is on the surface of the wafer after the regions 5 to 9 have been formed remains invariable when the regions 11 to 20 of the third layer 10 are formed, the surface of the oxide layer under the interconnection metallization layer is a single-step rather than a multistep one, and the thickness of the oxide layer (i.e. the step depth) is less than in the prior art circuit. This renders the surface of the oxide layer which is under the interconnection metallization less irregular and permits providing metallic interconnections (conductors) of smaller thickness and width, for as the oxide layer surface becomes less irregular, the probability of breakage of thin metallic interconnections (conductors) is minimized.

Besides, as the metallic interconnections become less thick, the minimum distance therebetween is reduced.

All this provides for a higher degree of circuit integration.

The absence of thermal treatment in an oxidizing atmosphere, in forming all regions 11 to 20 of the third layer 10, eliminates the need to open contact holes and enables deep diffusion of dopants of both types at a time. This reduces the number of process steps and simplifies the method.

The opening contact holes being no more required also increases the degree of circuit integration through reduction in size of the regions 11 to 20 of the third layer 10, since it is no more necessary to align the contact holes with said regions 11 to 20.

If the requirements to the distribution of dopants in the regions 11 to 20 of the third layer 10 cannot be met by simultaneous deep diffusion, the dopants of the first and second types are diffused separately, but again in an inert medium. In this case, the ionic implantation of the dopant of the first type is followed by additional deep diffusion of this dopant.

The provision of p-n-p transistors, in the proposed circuit, along the n-p-n transistors and n-resistors along with p-resistors permits extending the functional possibilities of the circuit, i.e. increasing the number of various devices that can be built around such an integrated circuit, as well as improving such parameters thereof as the degree of integration and reliability and, for example in the case of a semiconductor integrated memory, its fast response and power consumption.

The presence of n-resistors in the proposed circuit provides for a higher degree of integration for such resistors, unlike p-resistors, are self-isolated. For example, a resistor rated at 700 ohms occupies, in the proposed circuit, an area of 350 square microns. At the same rating, a resistor in the prior art circuit occupies an area of 1,000 square microns, i.e. an area almost three times greater. p-n-p transistors can be used instead of current-setting resistors in logic gates, decoders and other devices, which is another factor improving the degree of integration of a circuit using such components.

For example, a resistor rated at 20 kilohms in the prior art circuit occupies an area of 1,600 square microns, while the substituting p-n-p transistor occupies an area of 300 square microns, i.e. an area almost five times smaller.

The use of the proposed method has made it possible to produce a bipolar ROM circuit with a memory capacity of 64K. The device occupies an area of less than 30 sq.mm on the chip and contains more than 80 thousand transistors, i.e. an average of about 2,700 transistors per square millimeter.

For a better understanding of the invention, the following examples of its practical embodiment are given by way of illustration.

EXAMPLE 1

Formed on a boron-doped silicon substrate 1 (FIG. 1a) with a resistivity of 10 ohm.cm, in a first step of photolithography and diffusion of antimony, are the n-regions 2 (FIG. 1b) of the first layer.

Then, chloride epitaxy is used to grow the single-crystal epitaxial layer 3 (FIG. 1c) of p-type silicon, having a thickness of 2 microns and a resistivity of 0.5 ohm.cm.

Thereafter, phosphorus is ionically implanted into local surface portions prepared in a second step of photolithography to form the n-regions 5, 6, 7, 8 and 9

(FIG. 1d) of the second layer 4. The ion energy during the implantation is 40 keV, while the implanted dose is 7μ C/sq.cm. A photoresist is used as the masking coat during the ionic implantation.

After the photoresist has been removed, the phosphorus is diffused by deep diffusion with simultaneous oxidation of the surface. The diffusion is conducted for 60 minutes in dry oxygen, then 20 minutes in wet oxygen and, finally, 40 minutes in dry oxygen. The diffusion temperature is 1,150° C. Therewith, an oxide layer 40 microns thick is formed on the surface of the resulting structure, which serves as a mask during the subsequent steps.

Then, the third layer 10 (FIG. 1e) is formed, first by opening holes in a third step of photolithography, wherethrough singly charged phosphorus ions with an energy of 40 keV are implanted to form the n-regions 16, 17, 18, 19 and 20, the implanted dose being 700μ C/sq.cm.

This is followed by a fourth step of photolithography, wherein holes are opened in the same oxide, through which singly charged boron ions with an energy of 40 keV are implanted to form the p-regions 11, 12, 13, 14 and 15 of the third layer 10, the implanted dose being 70μ C/sq.cm.

Thereafter, the implanted dopants are diffused and annealed in a nitrogen atmosphere at 1,000° C. for 30 minutes.

Finally, a 1 micron thick aluminum layer is deposited and, in a fifth step of photolithography, the interconnections are metallized.

EXAMPLE 2

Formed on a boron-doped silicon substrate 1 (FIG. 1a) with a resistivity of 12 ohm.cm, in a first step of photolithography and ionic doping with arsenic, are the n-regions 2 (FIG. 1b) of the first n-layer.

Then, the techniques of vacuum and chloride epitaxy are sequentially used to grow the single-crystal epitaxial layer 3 (FIG. 1c) of p-type silicon, having a thickness of 2.5 microns and a resistivity of 0.5 ohm.cm.

Thereafter, phosphorus is ionically implanted into local surface portions prepared in a second step of photolithography to form the n-regions 5, 6, 7, 8 and 9 (FIG. 1d) of the second layer 4, the ion energy during the implantation being 50 keV and the implanted dose being 10μ C/sq.cm. A photoresist is used as the masking coat during the ionic implantation.

After the photoresist has been removed, the phosphorus is diffused with simultaneous oxidation of the surface. The diffusion is conducted for 20 minutes in dry oxygen, 20 minutes in wet oxygen and 50 minutes again in dry oxygen. The diffusion temperature is 1,150° C. As a result, an oxide layer 0.4 microns thick is formed on the surface of the structure, which serves as a mask in the subsequent steps.

The third layer 10 (FIG. 1e) is then formed, first by opening holes in a third step of photolithography, wherethrough singly charged boron ions with an energy of 40 keV are implanted to form the p-regions 11, 12, 13, 14 and 15, the implanted dose being 1,000μ C/sq.cm.

Then, in the same oxide, holes are opened in a fourth step of photolithography, through which singly charged phosphorus ions with an energy of 100 keV are implanted to form the n-regions 16, 17, 18, 19 and 20 of the third layer 10, the implanted dose being 300μ C/sq.cm.

This is followed by diffusion and annealing of the implanted dopants in a nitrogen atmosphere at 1,000° C. for 30 minutes.

Finaly, a 1 micron thick molybdenum layer is deposited and, in a fifth step of photolithography, the interconnections are metallized.

EXAMPLE 3

Here, in contrast to Example 1, the third step fo photolithography is followed by ionic implantation of singly charged arsenic ions with an energy of 60 keV, the implanted dose being 1,000μ C/sq.cm. Then, the arsenic is diffused and annealed in an argon atmosphere at 1,000° C. for 30 minutes.

All the subsequent steps, starting with the fourth one, are as in Example 1.

EXAMPLE 4

A semiconductor integrated circuit is obtained, having a p-substrate 1 (FIG. 1e) with a majority carrier concentration of $10^{15}$ cm$^{-3}$, which includes the n-regions 2 with a majority carrier concentration of $10^{19}$ cm$^{-3}$.

The epitaxial p-layer 3 has a majority carrier concentration of $5\cdot10^{16}$ cm$^{-3}$, and the n-regions 5, 6, 7, 8 and 9 located therein have a majority carrier concentration of $5\cdot10^{17}$ cm$^{-3}$.

The p-regions 11, 12, 13, 14 and 15 have a majority carrier concentration of $5\cdot10^{18}$ cm$^{-3}$, and the n-regions 16, 17, 18, 19 and 20 have a majority carrier concentration of $10^{20}$ cm$^{-3}$.

What is claimed is:

1. A method of making semiconductor integrated circuits, comprising
    forming in the surface layer of a p conductivity type semiconductor substrate a first layer including a plurality of n conductivity type layers;
    depositing on the surface of said substrate an epitaxial layer of p conductivity type;
    forming in said epitaxial layer a second layer including a plurality of regions of n conductivity type, with an oxide layer being formed on the surface;
    forming in the surface layer a third layer including a plurality of p conductivity type and n conductivity type regions, including the steps of opening holes in said oxide layer to form regions of a first conductivity type,
    implanting a dopant of a first type,
    opening holes in the same oxide layer to form regions of a second conductivity type,
    implanting a dopant of a second type in a concentration insufficient for inverting the conductivity type in said regions of the first conductivity type, and
    depth diffusing said dopants of both types in an inert medium; and
    applying metal conductors.

2. A method as claimed in claim 1, wherein said ionic implantation of said dopant of said first type is followed by additional deep diffusion of said dopant in an inert medium.

\* \* \* \* \*